(12) United States Patent
Lin et al.

(10) Patent No.: US 9,972,623 B1
(45) Date of Patent: May 15, 2018

(54) SEMICONDUCTOR DEVICE INCLUDING BARRIER LAYER AND MANUFACTURING METHOD THEREOF

(71) Applicant: UNITED MICROELECTRONICS CORP., Hsin-Chu (TW)

(72) Inventors: Chun-Hao Lin, Kaohsiung (TW); Shou-Wei Hsieh, Hsin-Chu (TW); Hsin-Yu Chen, Nantou County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/375,177

(22) Filed: Dec. 12, 2016

(30) Foreign Application Priority Data

Nov. 17, 2016 (TW) .............................. 105137639 A

(51) Int. Cl.
*H01L 27/092* (2006.01)
*H01L 21/8238* (2006.01)
*H01L 29/51* (2006.01)
*H01L 21/311* (2006.01)

(52) U.S. Cl.
CPC ...... *H01L 27/092* (2013.01); *H01L 21/31144* (2013.01); *H01L 21/823828* (2013.01); *H01L 21/823857* (2013.01); *H01L 29/517* (2013.01)

(58) Field of Classification Search
CPC ....... H01L 21/823821; H01L 21/31144; H01L 1127/092; H01L 21/823828–21/82385; H01L 2007/11866; H01L 21/823857; H01L 27/092; H01L 27/0924; H01L 29/517
See application file for complete search history.

(56) References Cited

U.S. PATENT DOCUMENTS

| 8,853,069 | B2 | 10/2014 | Kim |
| 9,384,962 | B2 | 7/2016 | Hwang |
| 2004/0106249 | A1* | 6/2004 | Huotari ............. H01L 21/28088 438/216 |
| 2012/0244669 | A1* | 9/2012 | Liao ................ H01L 21/823807 438/212 |

* cited by examiner

*Primary Examiner* — Tucker J Wright
(74) *Attorney, Agent, or Firm* — Winston Hsu

(57) ABSTRACT

A manufacturing method of a semiconductor device includes the following steps. A barrier layer is formed in a first region and a second region of a semiconductor substrate. The barrier layer formed in the first region is thinned before a step of forming a first work function layer on the barrier layer. The first work function layer formed on the first region is then removed. The process of thinning the barrier layer in the first region and the process of removing the first work function layer in the first region are performed separately for ensuring the coverage of the first work function layer in the second region. The electrical performance of the semiconductor device and the uniformity of the electrical performance of the semiconductor device may be improved accordingly.

3 Claims, 17 Drawing Sheets

12
SEMICONDUCTOR DEVICE INCLUDING BARRIER LAYER AND MANUFACTURING METHOD THEREOF

BACKGROUND OF THE INVENTION

1. Field of the Invention

The present invention relates to a semiconductor device and a manufacturing method thereof, and more particularly, to a semiconductor device including a barrier layer with different thicknesses in different regions and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly.

Poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effects. This increases equivalent thickness of the gate dielectric layer, reduces gate capacitance and worsens a driving force of the devices. Therefore, work function metals that are suitable for use as the high-k gate dielectric layer are used to replace the conventional poly-silicon gate to be the control electrode. However, transistors having different conductivity types and/or different threshold voltages are required in integrated circuits, and gate stacks of these transistors may be different from one another for presenting different conductivity types and/or different threshold voltages. Accordingly, for the related industries, it is important to integrate manufacturing processes of these gate stacks efficiently.

SUMMARY OF THE INVENTION

A semiconductor device and a manufacturing method thereof are provided in the present invention. A barrier layer in a first region is thinned before a step of forming a first work function layer, and the first work function layer in the first region is removed subsequently. The thinning process of the barrier layer in the first region and the removing process of the first work function layer in the first region are performed separately for avoiding etching the first work function layer in an adjacent second region and influencing the coverage of the first work function layer in the second region when one etching process is used to thin the barrier layer in the first region and remove the first work function layer in the first region at the same time.

According to an embodiment of the present invention, a manufacturing method of a semiconductor device is provided. The manufacturing method includes the following steps. A semiconductor substrate is provided. The semiconductor substrate includes a first region and a second region adjacent to the first region. A barrier layer is formed on the semiconductor substrate. The barrier layer is formed in the first region and the second region. A first etching process is performed for thinning the barrier layer in the first region. After the first etching process, the barrier layer includes a first part and a second part. The first part is at least partially disposed in the first region and has a first thickness. The second part is disposed in the second region and has a second thickness. The first thickness is less than the second thickness. A first work function layer is formed on the barrier layer in the first region and the second region after the first etching process. A second etching process is then performed to remove the first work function layer in the first region.

According to an embodiment of the present invention, a semiconductor device is provided. The semiconductor device includes a first conductivity type transistor and a second conductivity type transistor. The first conductivity type transistor includes a first gate structure including a first barrier layer. The second conductivity type transistor is disposed adjacent to the first conductivity type transistor. The second conductivity type transistor includes a second gate structure. The second gate structure includes a second barrier layer and a second conductivity type work function layer. The first barrier layer is thinner than the second barrier layer. The first barrier layer and the second barrier layer are directly connected with each other, and a step structure is formed at a juncture of the first barrier layer and the second barrier layer. The second conductivity type work function layer is disposed on the second barrier layer and a part of the first barrier layer. The second conductivity type work function layer covers the step structure.

In the semiconductor device and the manufacturing method thereof in the present invention, the first etching process for thinning the barrier layer in the first region and the second etching process for removing the first work function layer in the first region are not performed successively, and the first etching process is performed before the step of forming the first work function layer. Compared with an etching time of a single etching process for removing the first work function layer in the first region and thinning the barrier layer in the first region at the same time, the etching time of the second etching process in the present invention may become relatively shorter. The etching condition of the first work function layer in the adjacent second region may be improved for avoiding influencing the coverage of the first work function layer in the second region, and the electrical performance of the semiconductor device and the uniformity of the electrical performance may be improved accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 and FIG. 2 are schematic drawings illustrating a manufacturing method of a semiconductor device according to a first embodiment of the present invention, wherein FIG. 2 is a schematic drawing in a step subsequent to FIG. 1.

FIGS. 3-7 are schematic drawings illustrating a manufacturing method of a semiconductor device according to a second embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

FIGS. 8-17 are schematic drawings illustrating a manufacturing method of a semiconductor device according to a third embodiment of the present invention, wherein FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, FIG. 13 is a schematic drawing in a step subsequent to FIG. 12, FIG. 14 is a schematic drawing in a step subsequent to FIG. 13, FIG. 15 is a schematic drawing in a step subsequent to FIG. 14, FIG. 16 is a schematic drawing in a step subsequent to FIG. 15, and FIG. 17 is a schematic drawing in a step subsequent to FIG. 16.

DETAILED DESCRIPTION

Figure 1:
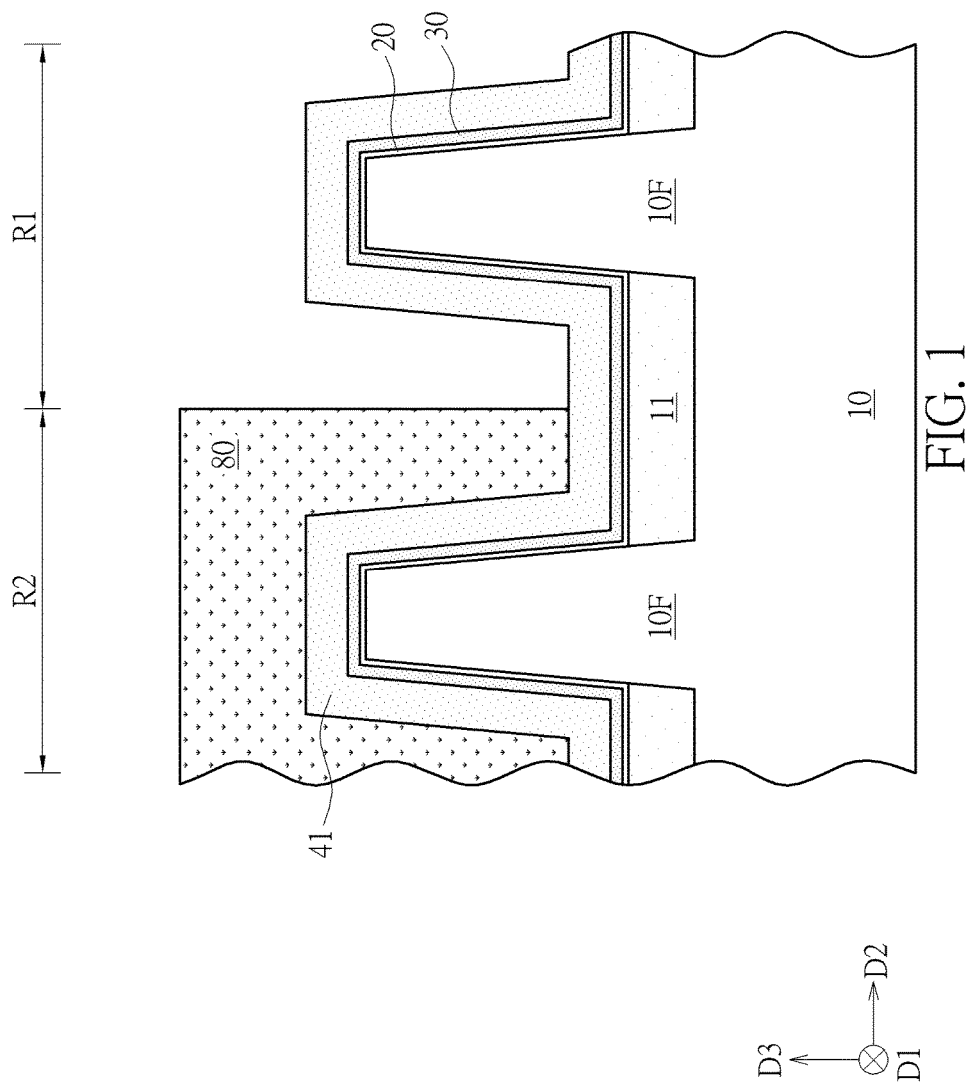
Figure 2:
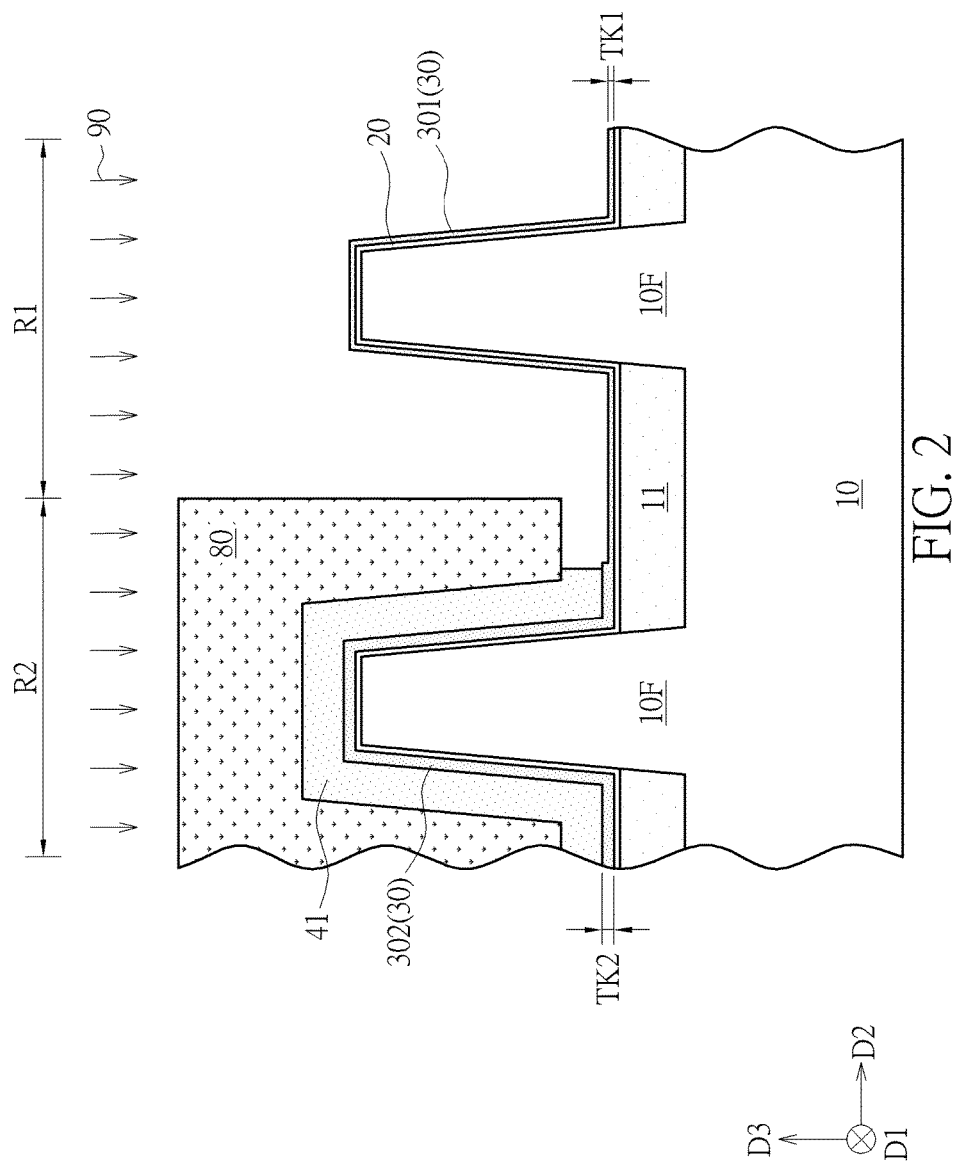

Please refer to FIG. 1 and FIG. 2. FIG. 1 and FIG. 2 are schematic drawings illustrating a manufacturing method of a semiconductor device according to a first embodiment of the present invention. The manufacturing method of the semiconductor device in this embodiment includes the following steps. As shown in FIG. 1, a semiconductor substrate 10 is provided. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. The semiconductor substrate 10 includes at least one fin structure 10F, and the fin structure 10F may include a fin structure made of a semiconductor material. In this embodiment, the semiconductor substrate 10 may include a plurality of the fin structures 10F. Each of the fin structures 10F may be elongated in a first direction D1, and the fin structures 10F may be repeatedly disposed in a second direction D2. The first direction D1 may be orthogonal to the second direction D2, but not limited thereto. The fin structures 10F may be formed by performing a patterning process, such as a multiple exposure process, to the semiconductor substrate 10, and the fin structures 10F may be separated from one another by a shallow trench isolation 11. The shallow trench isolation 11 may include one layer or multiple layers of insulation materials, such as an oxide insulation material, but not limited thereto. In this embodiment, the semiconductor substrate 10 may include a first region R1 and a second region R2. The second region R2 is disposed adjacent to the first region R1. A part of the fin structures 10F may be disposed in the first region R1, and another part of the fin structures 10F may be disposed in the second region R2. For example, the first region R1 in this embodiment may include a first conductivity type transistor region for forming first conductivity type transistors, and the second region R2 may include a second conductivity type transistor region for forming second conductivity type transistors. The first conductivity type and the second conductivity type mentioned above may be complementary to each other. For instance, the first region R1 may include an N type transistor region, and the second region R2 may include a P type transistor region, but not limited thereto. In some embodiments, the first region R1 and the second region R2 may be transistor regions having an identical conductivity type with different gate stacks. For example, the first region R1 may be a low threshold voltage (LTV) N type transistor region, and the second region R2 may be a standard threshold voltage (STV) N type transistor region.

As shown in FIG. 1, a gate dielectric layer 20 is formed on the fin structures 10F and the shallow trench isolation 11 in the first region R1 and the second region R2. A barrier layer 30 is formed on the gate dielectric layer 20, and a first work function layer 41 is formed on the barrier layer 30. In this embodiment, the gate dielectric layer 20 may include a stack structure of an interfacial layer and a high dielectric constant (high-k) dielectric layer. The high-k dielectric layer may include dielectric materials such as hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. The barrier layer 30 may include a metal nitride layer such as a tantalum nitride (TaN) layer or other suitable metal compound barrier materials. The first work function layer 41 may include a P type work function layer such as titanium nitride (TiN) or other suitable P type work function materials (such as titanium carbide, TiC). The first work function layer 41 may include a single layer structure or a multiple layer structure. Subsequently, a patterned mask layer 80 is formed on the first work function layer 41. The patterned mask layer 80 covers the first work function layer 41 in the second region R2 and does not cover the first work function layer 41 in the first region R1.

As shown in FIG. 2, an etching process 90 with the patterned mask layer 80 as a mask is then performed for removing the first work function layer 41 in the first region R1 and thinning the barrier layer 30 in the first region R1. After the etching process 90, the barrier layer 30 includes a first part 301 in the first region R1 and a second part 302 in the second region R2. The first part 301 has a first thickness TK1, the second part 302 has a second thickness TK2, and the first thickness TK1 is less than the second thickness TK2. For example, the second thickness TK2 may be about 13 angstroms, and the first thickness TK1 may be about 8 angstroms after being thinned, but not limited thereto. In this embodiment, the etching process 90 may be a wet etching process preferably, such as a SC-2 process using an etchant including hydrochloric acid (HCl) and hydrogen peroxide ($H_2O_2$), but not limited thereto. The manufacturing process may be simplified because the etching process 90 may be used to remove the first work function layer 41 in the first region R1 and thin the barrier layer 30 in the first region R1. However, the wet etching process is an isotropic etching process with obvious side etching effect (or lateral etching effect), and the etchant concentration and/or the etching time of the etching process 90 has to be increased (in comparison with an etching process for removing the work function layer 41 only) for removing the first work function layer 41 in the first region R1 and thinning the barrier layer 30 in the first region R1 after the first work function layer 41 in the first region R1 is removed. Accordingly, the side etching condition of the first work function layer 41 in the second region R2 may become severe, an area of the metal boundary effect (MBE) of a transistor formed subsequently in the second region R2 may be reduced, and the electrical performance and the uniformity thereof may be badly influenced. For example, when the transistor formed in the second region R2 is a P type transistor and the first work function layer 41 is a P type work function layer, the threshold voltage (Vts) of the P type transistor may become higher because the first work function layer 41 is etched severely by the side etching effect. The uniformity of the side etching effect will become worse when the etching time is increased, and the uniformity of the threshold voltages between the transistors of the same type will become worse too.

Figure 3:
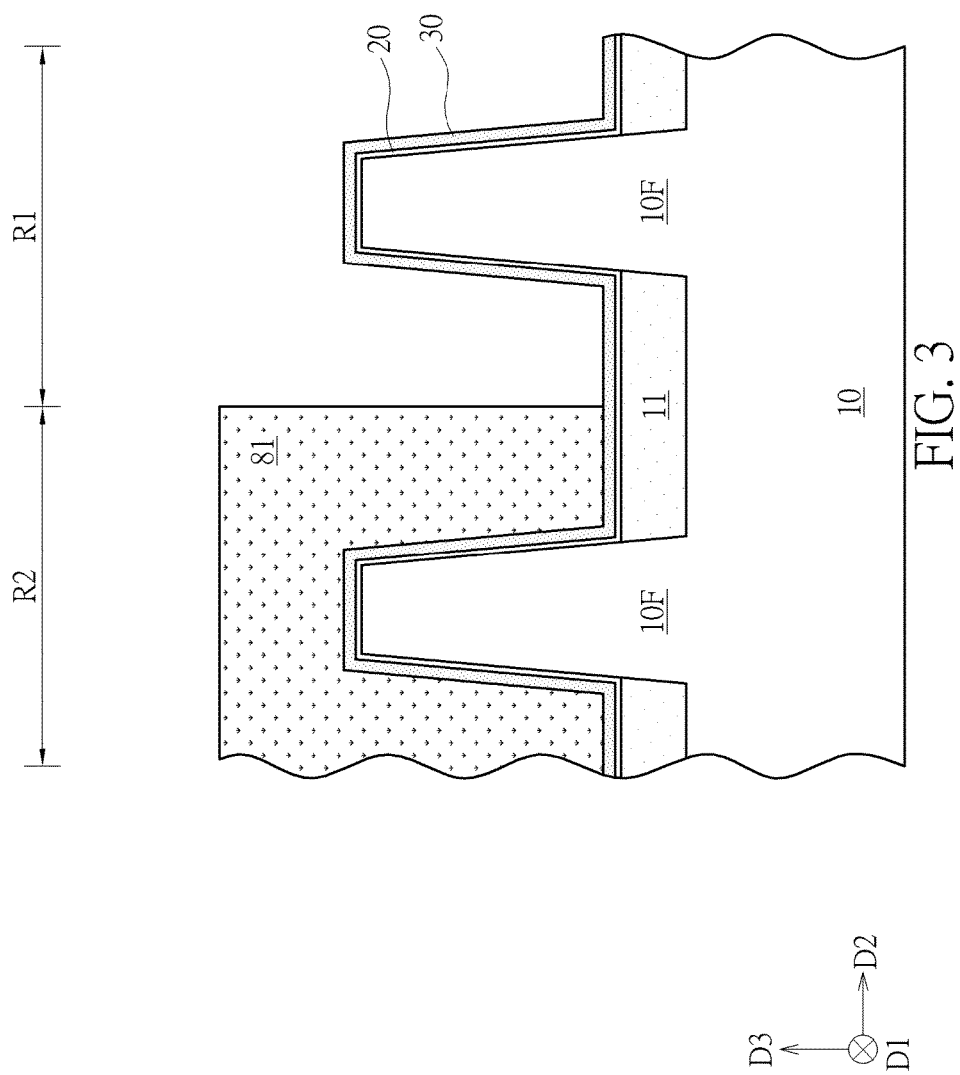
Figure 4:
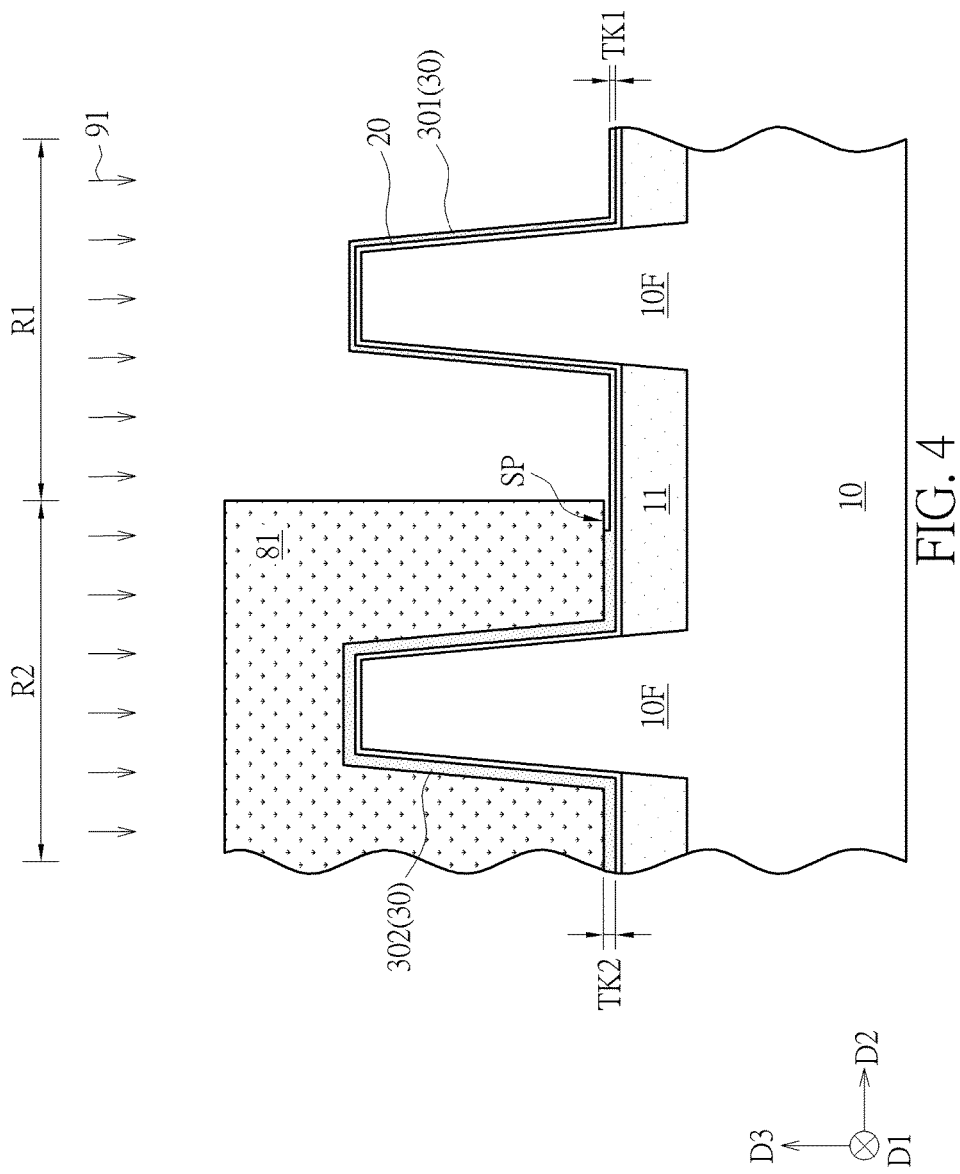

Please refer to FIGS. 3-7. FIGS. 3-7 are schematic drawings illustrating a manufacturing method of a semiconductor device according to a second embodiment of the present invention. The manufacturing method of the semiconductor device in this embodiment includes the following steps. As shown in FIG. 3, the semiconductor substrate 10 is provided. The semiconductor substrate 10 includes the first region R1 and the second region R2 adjacent to the first region R1. The semiconductor substrate 10 may include a plurality of the fin structures 10F. The fin structures 10F are separated from one another by the shallow trench isolation 11. A part of the fin structures 10F may be disposed in the first region R1, and another part of the fin structures 10F may be disposed in the second region R2. The barrier layer 30 is then formed on the semiconductor substrate 10. Before the step of forming the barrier layer 30, the gate dielectric layer 20 may be conformally formed on the fin structures 10F and the shallow trench isolation 11 in the first region R1 and the second region R2, and the barrier layer 30 may be conformally formed on the gate dielectric layer 20. In other words, the barrier layer 30 is also formed in the first region R1 and the second region R2, and the gate dielectric layer 20 may include a first part 201 in the first region R1 and a second part 202 in the second region R2. As shown in FIG. 3 and FIG. 4, a first etching process 91 is performed for thinning the barrier layer 30 in the first region R1. In some embodiments, a first patterned mask layer 81 may be formed on the barrier layer 30 before the first etching process 91. The first patterned mask layer 81 covers the barrier layer 30 in the second region R2. The barrier layer 30 in the first region R1 is not covered by the first patterned mask layer 81. Therefore, the first etching process 91 is performed with the first patterned mask layer as a mask, and the barrier layer 30 in the second region R2 is covered by the first patterned mask layer 81 in the first etching process 91. In some embodiments, the first etching process 91 may include a wet etching process, such as a SC-2 process using an etchant including hydrochloric acid and hydrogen peroxide, but not limited thereto. In some embodiments, the first etching process 91 may include other kinds of wet etching process or a dry etching process. After the first etching process 91, the barrier layer 30 includes a first part 301 and a second part 302. The first part 301 is at least partially disposed in the first region and has the first thickness TK1. The second part 302 is disposed in the second region R2 and has the second thickness TK2. The first thickness TK1 is less than the second thickness TK2. In this embodiment, the first part 301 of the barrier layer 30 and the second part 302 of the barrier layer 30 are directly connected with each other, and a step structure SP is formed at a juncture of the first part 301 and the second part 302. Additionally, the barrier layer 30 in the first region R1 is thinned uniformly and conformally by the first etching process 91 preferably, and the gate dielectric layer 20 under the barrier layer 30 is not exposed by removing the barrier layer 30 in any regions during the first etching process 91.

Figure 5:
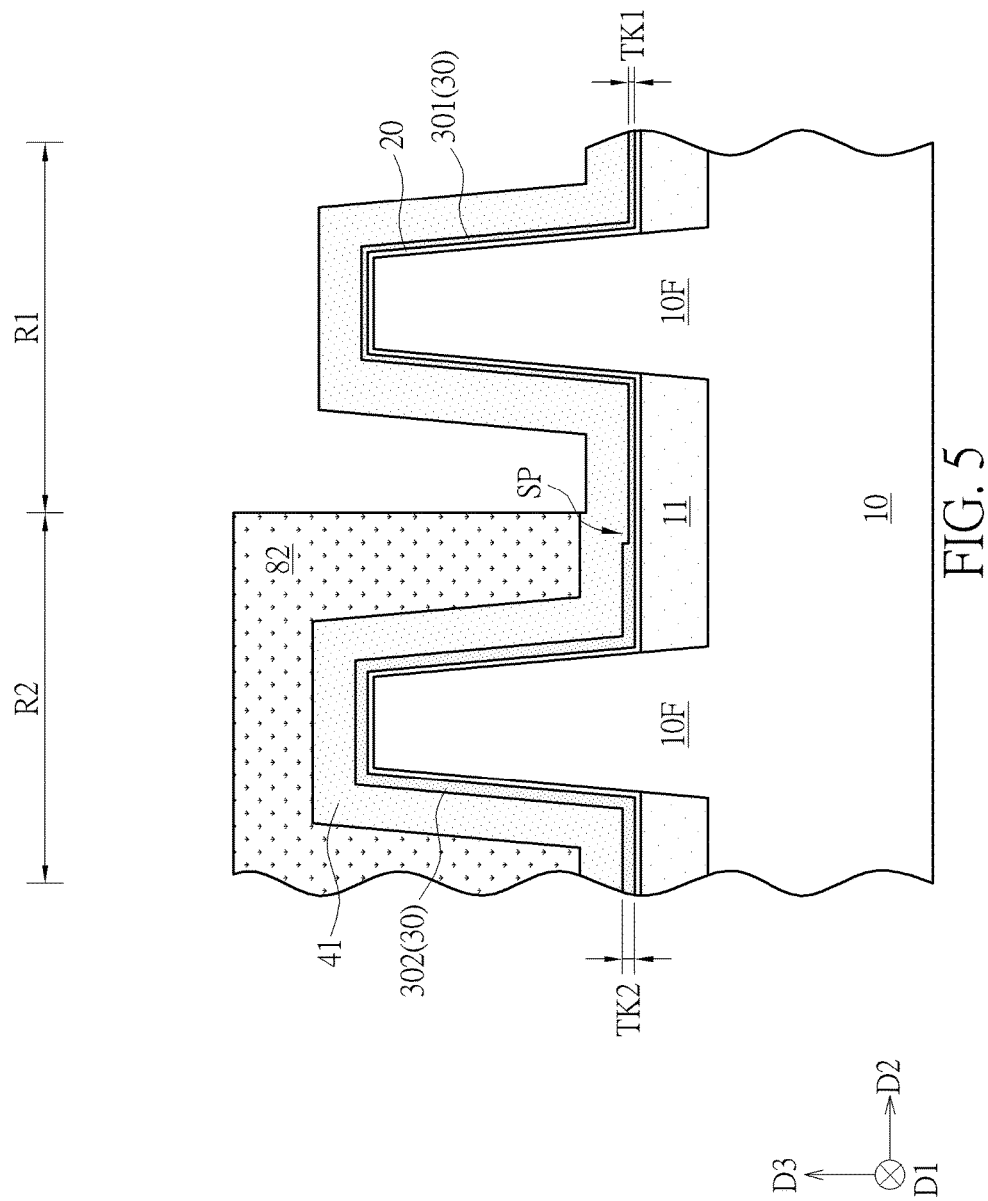
Figure 6:
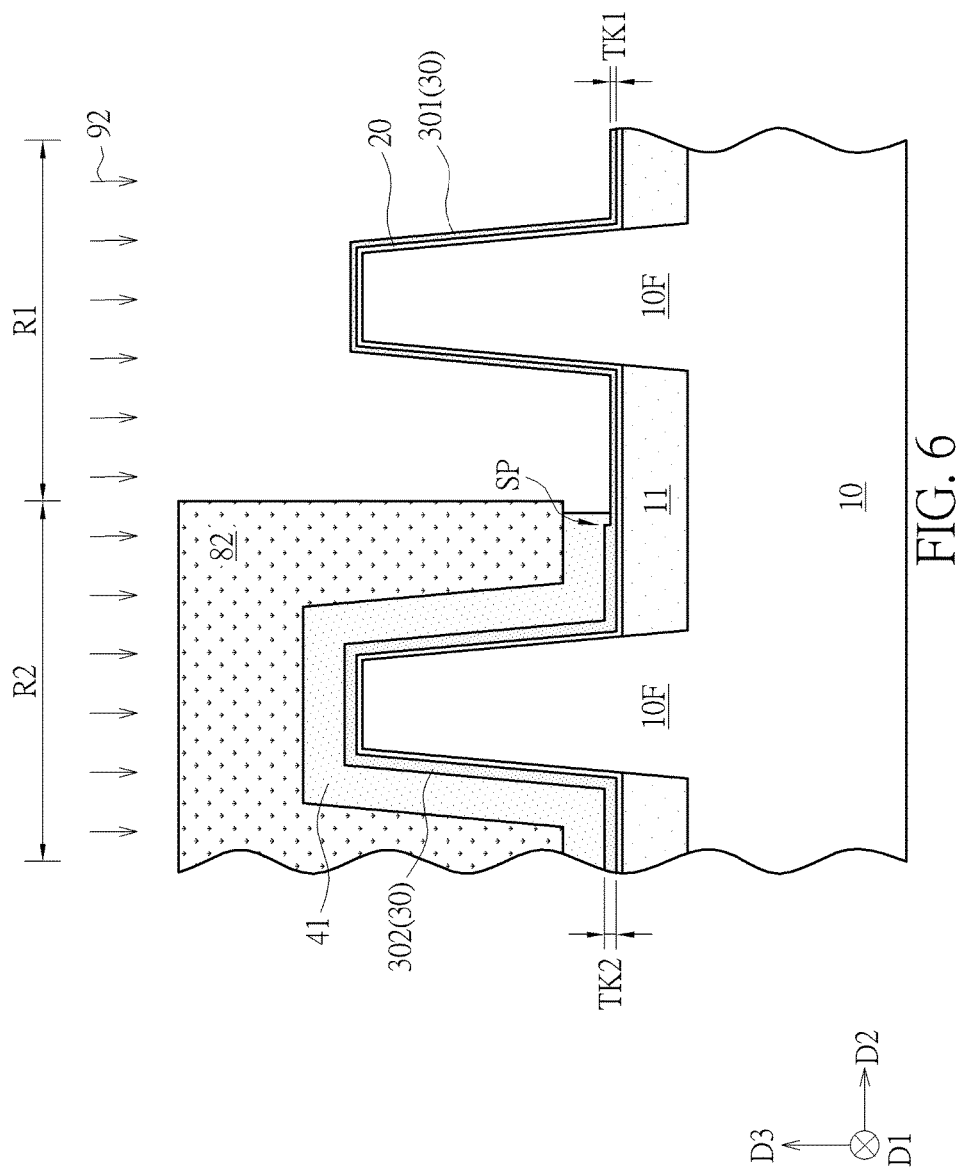

As shown in FIG. 4 and FIG. 5, the first patterned mask layer 81 is removed after the first etching process 91, and the first work function layer 41 is conformally formed on the barrier layer 30 in the first region R1 and the second region R2. As shown in FIG. 5 and FIG. 6, a second etching process 92 is then performed to remove the first work function layer 41 in the first region R1. In some embodiments, a second patterned mask layer 82 may be formed on the first work function layer 41 before the second etching process 92. The second patterned mask layer 82 covers the first work function layer 41 in the second region R2, and the first work function layer 41 in the first region is not covered by the second patterned mask layer 82. Therefore, the second etching process 92 is performed with the second patterned mask layer 82 as a mask, and the first work function layer 41 in the second region R2 is covered by the second patterned mask layer 82 in the second etching process 92. In some embodiments, the second etching process 92 may include a wet etching process, such as a SC-2 process using an etchant including hydrochloric acid and hydrogen peroxide, but not limited thereto. In some embodiments, the second etching process 92 may include other kinds of wet etching process or a dry etching process. It is worth noting that, in some embodiments, the pattern of the first patterned mask layer 81 mentioned above and the pattern of the second patterned mask layer 82 may be substantially identical to each other. The first patterned mask layer 81 and the pattern of the second patterned mask layer 82 may be formed respectively by an identical photomask for reducing the related manufacturing cost, but not limited thereto.

In some embodiments, the first etching process 91 mentioned above and the second etching process 92 may be the same type of wet etching process, such as the SC-2 process. In other words, an etchant component of the first etching process 91 may be identical to an etchant component of the second etching process 92, but an etchant concentration of the first etching process 91 is lower than an etchant concentration of the second etching process 92 preferably for reducing the etching time of the second etching process 92 while the barrier layer 30 does not have to be etched by the second etching process 92. The side etching condition of the first work function layer 41 in the second region R2 during the second etching process 92 may be improved, and the coverage of the first work function layer 41 in the second region R2 may be enhanced accordingly. Additionally, the first work function layer 41 in the second region R2 may cover the step structure SP in a vertical direction D3 after the second etching process 92 because the coverage of the first work function layer 41 in the second region R2 is enhanced. In other words, a part of the relatively thinner first part 301 of the barrier layer 30 may extend to the second region R2, and the first work function layer 41 in the second region R2 may cover the second part 302 of the barrier layer 30 and a part of the first part 301 of the barrier layer 30.

Figure 7:
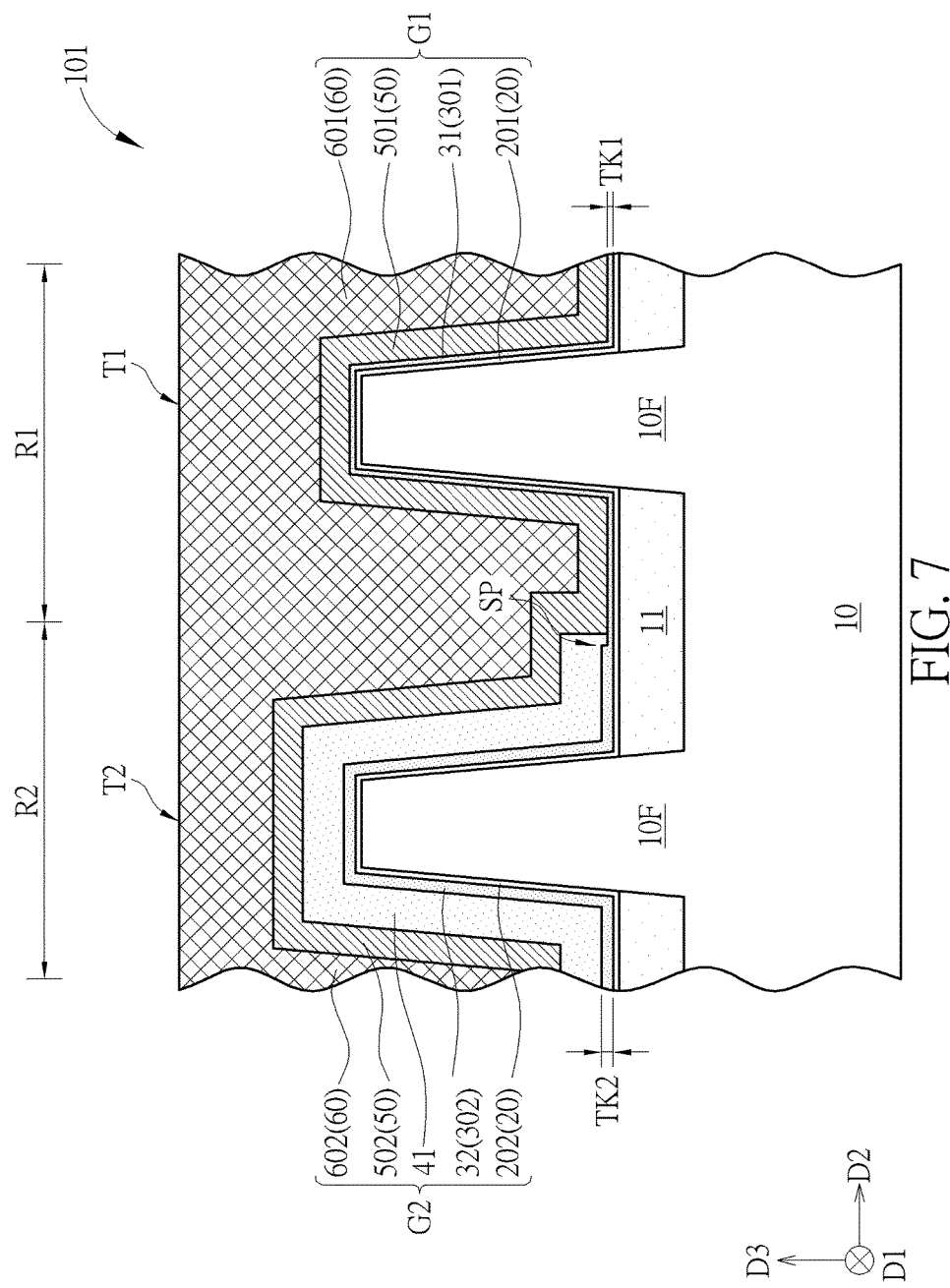

As shown in FIG. 6 and FIG. 7, the second patterned mask layer 82 is removed after the second etching process 92, and a second work function layer 50 is formed on the first work function layer 41 and the first part 301 of the barrier layer 30. In some embodiments, the conductivity type of the first work function layer 41 may be different from the conductivity type of the second work function layer 50. For example, the first work function layer 41 may be a P type work function layer and the second work function layer 50 may be an N type work function layer, but not limited thereto. The second work function layer 50 may include titanium aluminum carbide (TiAlC) or other suitable N type work function material (such as titanium aluminide, TiAl). A first part 501 of the second wok function layer 50 is formed in the first region R1, and a second part 502 of the second work function layer 50 is formed in the second region R2. A low resistivity layer 60 is then formed on the second work function layer 50. A first part 601 of the low resistivity layer 60 is formed in the first region R1, and a second part 602 of the low resistivity layer 60 is formed in the second region R2. The low resistivity layer 60 may include aluminum (Al), tungsten (W), copper (Cu), titanium aluminide (TiAl), or other suitable low resistivity materials. A top barrier layer (not shown) may be formed between the low resistivity layer 60 and the second work function layer 50 according to other considerations, and the barrier layer 30 may be regarded as a bottom barrier layer, but not limited thereto. The first part 201 of the gate dielectric layer 20, the first part 301 of the barrier layer 30, the first part 501 of the second work function layer 50, and the first part 601 of the low resistivity layer 60 may be used to form a first gate structure G1 of a first transistor T1. The second part 202 of the gate dielectric layer 20, the second part 302 of the barrier layer 30, the first work function layer 41, the second part 502 of the second work function layer 50, and the second part 602 of the low resistivity layer 60 may be used to form a second gate structure G2 of a second transistor T2. The first transistor T1 is disposed adjacent to the second transistor T2, and the first gate structure G1 is directly connected with the second gate structure G2.

As shown in FIG. 7, a semiconductor device 101 is provided in this embodiment. The semiconductor device 101 includes the first transistor T1 and the second transistor T2. In some embodiments, the first transistor T1 may be a first conductivity type transistor and the second transistor T2 may be a second conductivity type transistor. For example, the first conductivity type may be an N type and the second conductivity type may be a P type, the first transistor T1 may include an N type transistor, and the second transistor T2 may be a P type transistor, but not limited thereto. The first transistor T1 include the first gate structure G1, and the first gate structure G1 includes a first barrier layer 31 (i.e. the first part 301 of the barrier layer mentioned above). The second transistor T2 is disposed adjacent to the first transistor T1, and the second transistor T2 includes the second gate structure G2. The second gate structure G2 includes a second barrier layer 32 (i.e. the second part 302 of the barrier layer mentioned above) and the first work function layer 41. The first work function layer 41 may be a second conductivity type work function layer, such as a P type work function layer. The first barrier layer 31 is thinner than the second barrier layer 32. The first barrier layer 31 and the second barrier layer 32 are directly connected with each other, and the step structure SP is formed at a juncture of the first barrier layer 31 and the second barrier layer 32. The first work function layer 41 is disposed on the second barrier layer 32 and a part of the first barrier layer 31, and the first work function layer 41 covers the step structure SP.

In addition, the first gate structure G1 may further include the first part 501 of the second work function layer 50, and the second gate structure G2 may further include the second part 502 of the second work function layer 50. The second work function layer 50 may be a first conductivity type work function layer, such as an N type work function layer. The first part 501 of the second work function layer 50 and the second part 502 of the second work function layer 50 are directly connected with each other. The first part 501 of the second work function layer 50 is disposed on the first barrier layer 31, and the second part 502 of the second work function layer 50 is disposed on the first work function layer 41. In some embodiments, the first transistor T1 may be a low threshold voltage N type transistor and the second transistor T2 may be a low threshold voltage P type transistor because the first barrier layer 31 of the first transistor T1 is thinner than the second barrier layer 32 of the second transistor T2, but not limited thereto. In some embodiments, the second transistor T2 may be a standard threshold voltage N type transistor by adjusting the thickness of the first work function layer 41.

By the manufacturing method in this embodiment, the coverage of the first work function layer 41 in the second transistor T2 may be improved. The metal boundary effect of the first work function layer 41 in the second transistor T2 may be ensured, and the electrical performance of the second transistor T2 in the semiconductor device 101 and the uniformity thereof may be improved accordingly.

Figure 8:
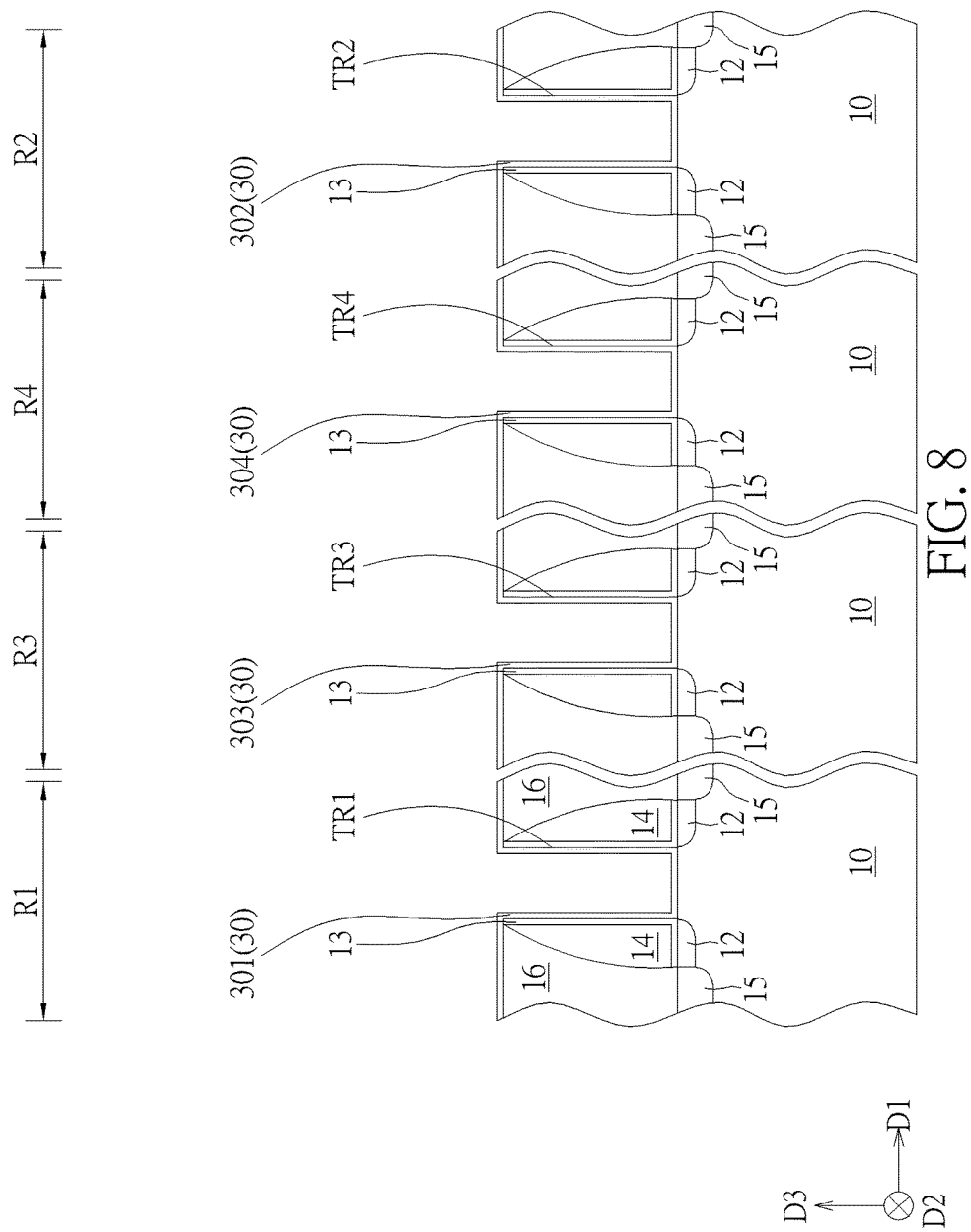

Please refer to FIGS. 8-17. FIGS. 8-17 are schematic drawings illustrating a manufacturing method of a semiconductor device according to a third embodiment of the present invention. The manufacturing method in this embodiment includes the following steps. As shown in FIG. 8, the difference between the second embodiment and this embodiment is that the semiconductor substrate 10 in this embodiment further includes a third region R3 and a fourth region R4. The first region R1, the second region R2, the third region R3, and the fourth region R4 may be regions for forming transistors having different conductivity types and/or different threshold voltages. For example, the first region R1 may be a low threshold voltage N type transistor region, the second region R2 may be a low threshold voltage P type transistor region, the third region R3 may be a standard threshold voltage N type transistor region, and the fourth region R4 may be a standard threshold voltage P type transistor region, but not limited thereto. A plurality of dummy gates (not shown) may be formed on the semiconductor substrate 10. The dummy gates and a first spacer 13 formed on the dummy gates and the semiconductor substrate 10 may be used to form a plurality of lightly doped regions 12 in the semiconductor substrate 10. A second spacer 14 formed on the first spacer 13 may be used to form a plurality of source/drain regions 15 in the semiconductor substrate 10. The dummy gates are removed after a step of forming an interlayer dielectric 16 for forming a first trench TR1 in the first region R1, a second trench TR2 in the second region R2, a third trench TR3 in the third region R3, and a fourth trench TR4 in the fourth region R4. The trenches may be filled with different stacked material structures for forming gate structures of different transistors. In other words, the replacement metal gate process may be applied in the manufacturing method of this embodiment, but not limited thereto. As shown in FIG. 8, the barrier layer 30 is then formed. The first part 301 of the barrier layer 30 is formed in the first region R1 and partly formed in the first trench TR1, the second part 302 of the barrier layer 30 is formed in the second region R2 and partly formed in the second trench TR2, a third part 303 of the barrier layer 30 is formed in the third region R3 and partly formed in the third trench TR3, and a fourth part 304 of the barrier layer 30 is formed in the fourth region R4 and partly formed in the fourth trench TR4. It is worth noting that the gate dielectric layer described in the second embodiment may also be formed in the trenches before the step of forming the barrier layer 30, and the gate dielectric layer is not shown in the figures of this embodiment for emphasize the stacked conductive layers in each of the gate structures.

Figure 9:
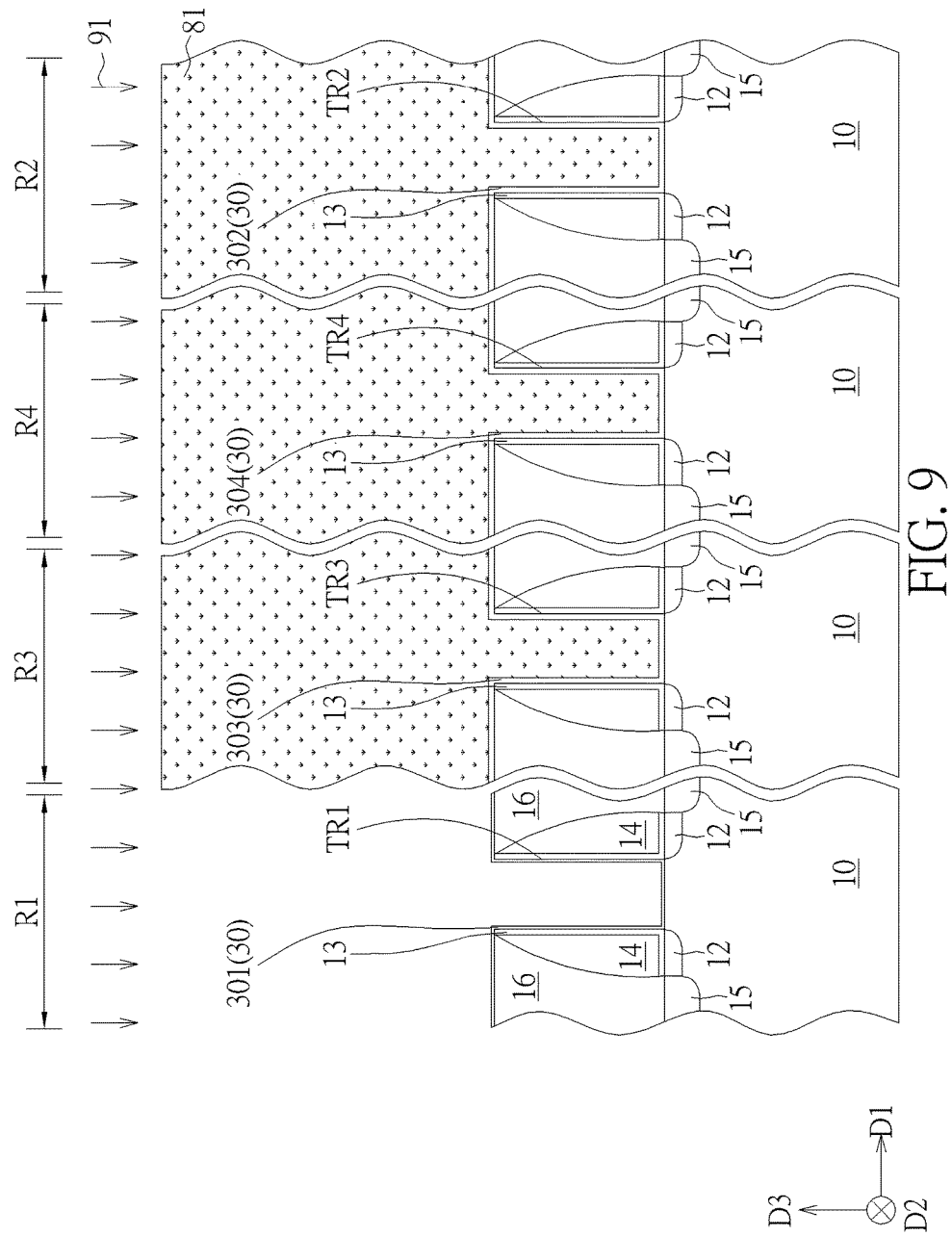
Figure 10:
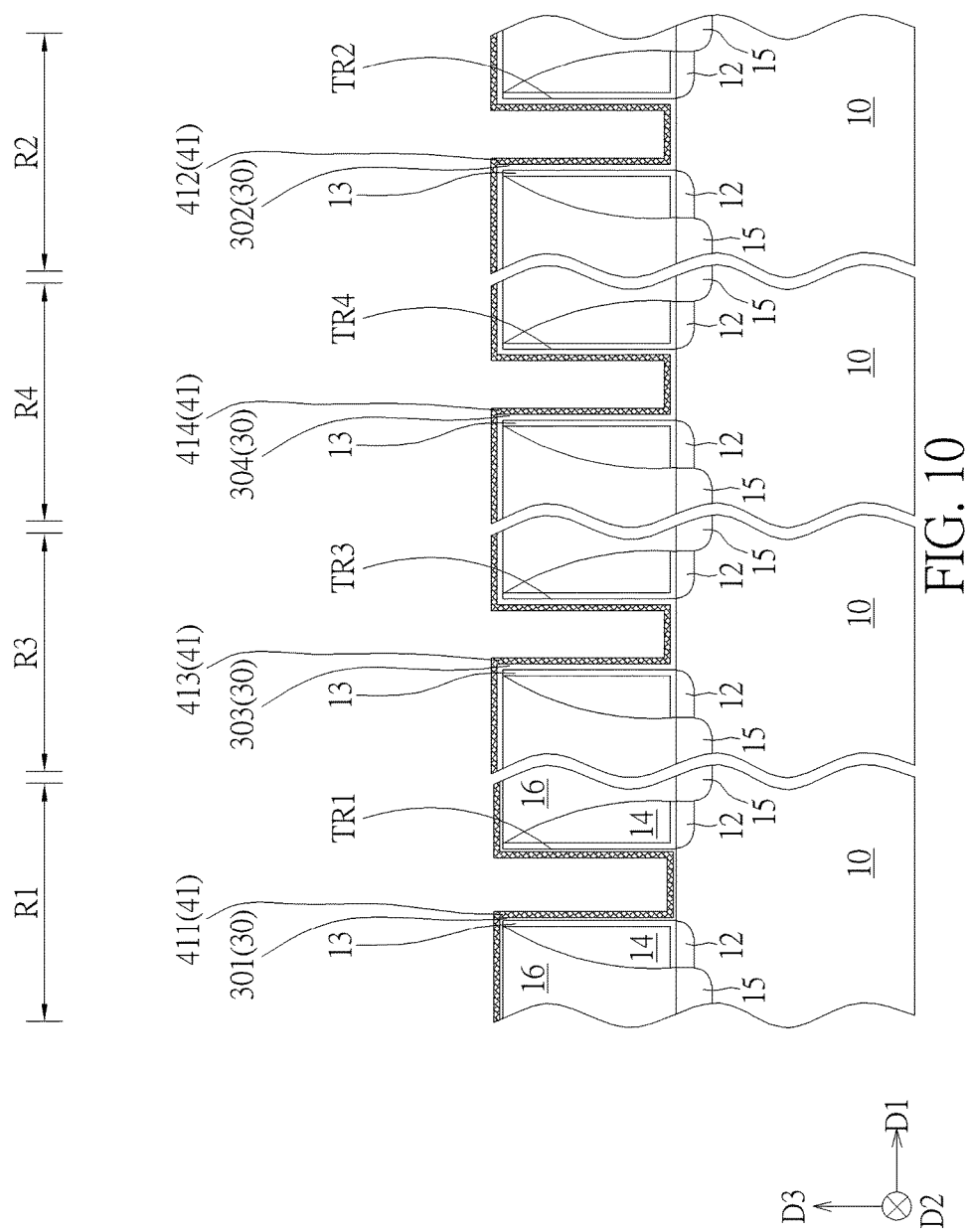
Figure 11:
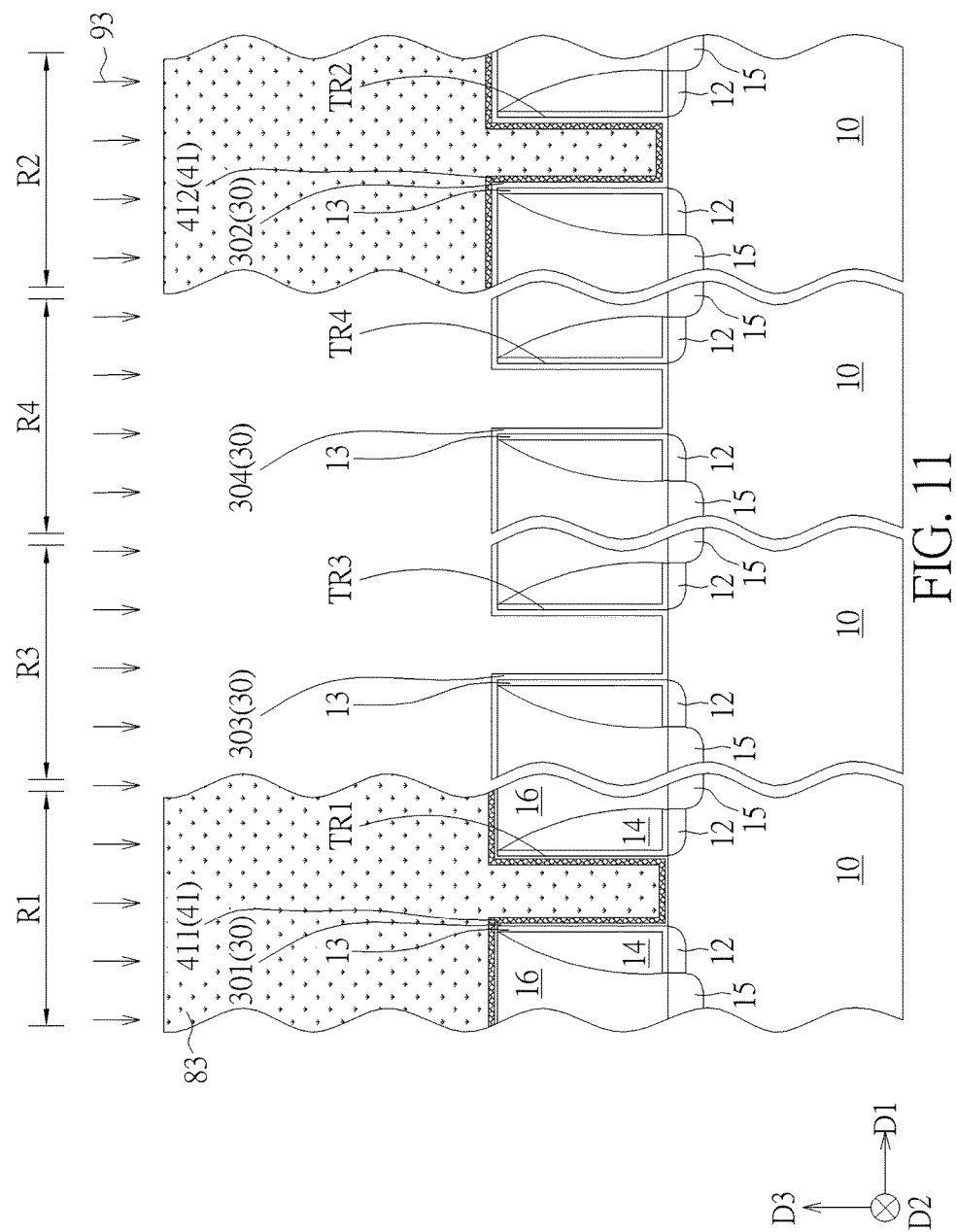

As shown in FIG. 9, the first etching process 9 is performed with the first patterned mask layer 81 as a mask for thinning the first part 301 of the barrier layer 30 in the first region R1. In the first etching process 91, the first patterned mask layer 81 covers the barrier layer 30 in the second region R2, the third region R3, and the fourth region R4. The first part 301 of the barrier layer 30 will become thinner than the second part 302, the third part 303, and the fourth part 304 after the first etching process 91. As shown in FIG. 9 and FIG. 10, the first patterned mask layer 81 is removed after the first etching process 91, and the first work function layer 41 is formed. A first part 411 of the first work function layer 41 is formed in the first region R1 and partly formed in the first trench TR1. A second part 412 of the first work function layer 41 is formed in the second region R2 and partly formed in the second trench TR2. A third part 413 of the first work function layer 41 is formed in the third region R3 and partly formed in the third trench TR3. A fourth part 414 of the first work function layer 41 is formed in the fourth region R4 and partly formed in the fourth trench TR4. As shown in FIG. 10 and FIG. 11, a third etching process 93 is then performed with a third patterned mask layer 83 as a mask for removing the third part 413 and the fourth part 414 of the first work function layer 41.

Figure 12:
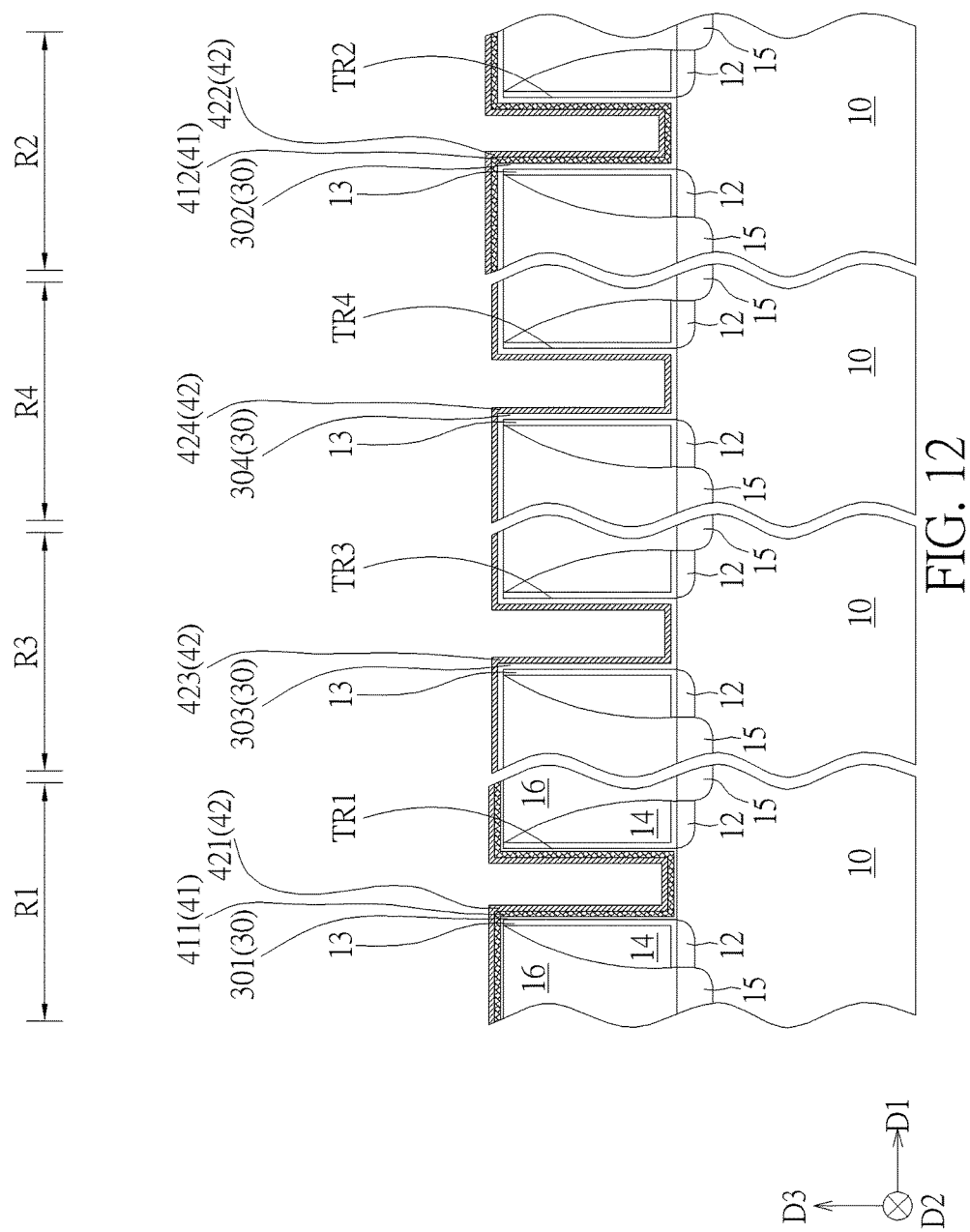
Figure 13:
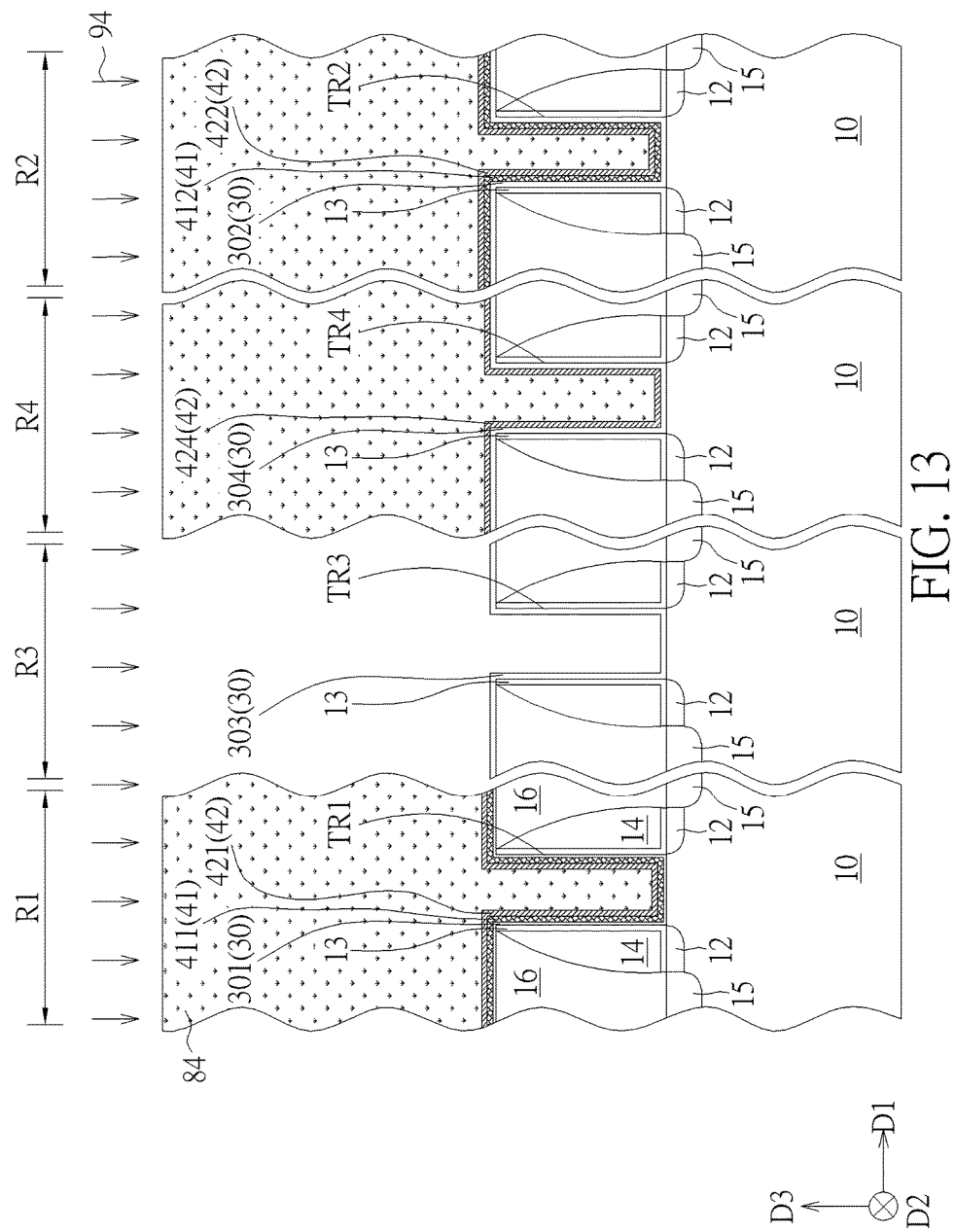

As shown in FIG. 11 and FIG. 12, the third patterned mask layer 83 is removed after the third etching process 93, and a third work function layer 42 is formed. A first part 421 of the third work function layer 42 is formed in the first region R1 and partly formed in the first trench TR1. A second part 422 of the third work function layer 42 is formed in the second region R2 and partly formed in the second trench TR2. A third part 423 of the third work function layer 42 is formed in the third region R3 and partly formed in the third trench TR3. A fourth part 424 of the third work function layer 42 is formed in the fourth region R4 and partly formed in the fourth trench TR4. The conductivity type of the third work function layer 42 is similar to that of the first work function layer 41 preferably, and the third work function layer 42 may include a P type work function layer, such as titanium nitride or other suitable P type work function materials, but not limited thereto. As shown in FIG. 12 and FIG. 13, a fourth etching process 94 is then performed with a fourth patterned mask layer 84 as a mask for removing the third part 423 of the third work function layer 42.

Figure 14:
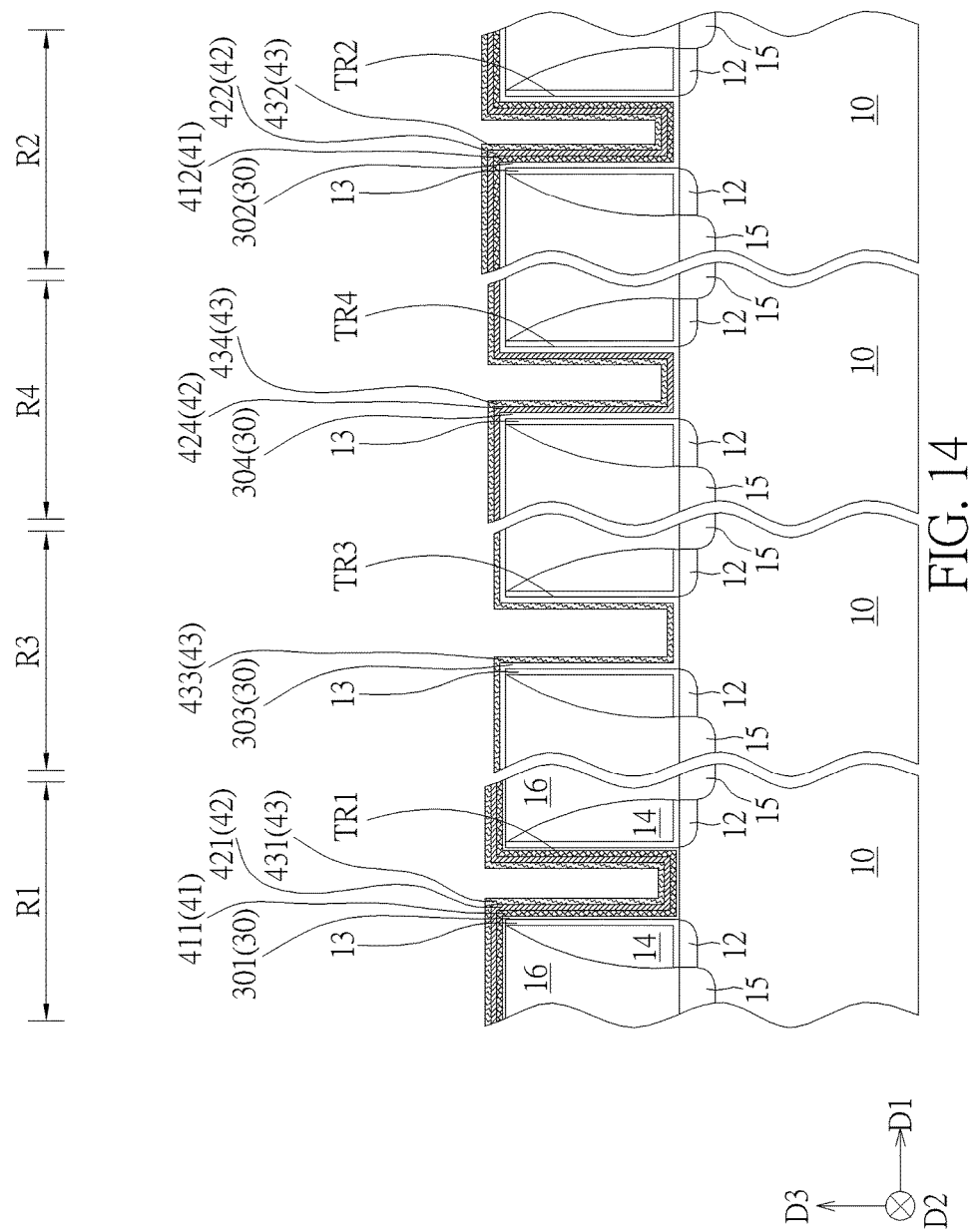
Figure 15:
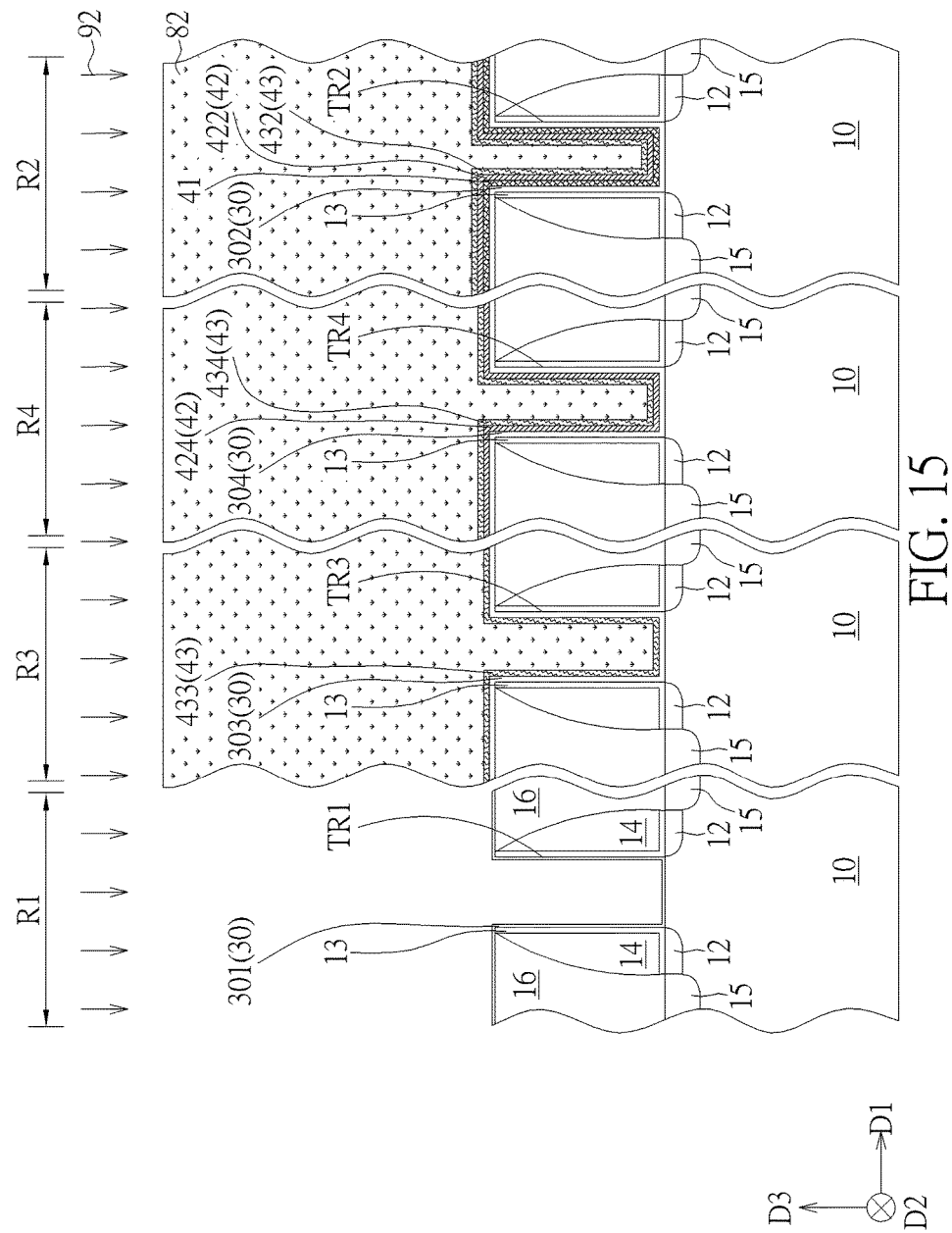

As shown in FIG. 13 and FIG. 14, the fourth patterned mask layer 84 is removed after the fourth etching process 94, and a fourth work function layer 43 is then formed. A first part 431 of the fourth work function layer 43 is formed in the first region R1 and partly formed in the first trench TR1. A second part 432 of the fourth work function layer 43 is formed in the second region R2 and partly formed in the second trench TR2. A third part 433 of the fourth work function layer 43 is formed in the third region R3 and partly formed in the third trench TR3. A fourth part 434 of the fourth work function layer 43 is formed in the fourth region R4 and partly formed in the fourth trench TR4. The conductivity type of the fourth work function layer 43 is similar to the conductivity type of the first work function layer 41 and the conductivity type of the third work function layer 42 preferably, and the fourth work function layer 43 may include a P type work function layer, such as titanium nitride or other suitable P type work function materials, but not limited thereto. As shown in FIG. 14 and FIG. 15, the second etching process 92 is then performed with the second patterned mask layer 82 as a mask for removing the first part 411 of the first work function layer 41, the first part 421 of the third work function layer 42, and the first part 431 of the fourth work function layer 43 in the first region R1. In other words, the second conductivity type work function layer in this embodiment may be formed by a stack structure including the first work function layer 41, the third work function layer 42, and the fourth work function layer 43. The thicknesses of the second conductivity type work function layer in the second region R2, the third region R3, and the fourth region R4 may be different from one another by the manufacturing method described above.

Figure 16:
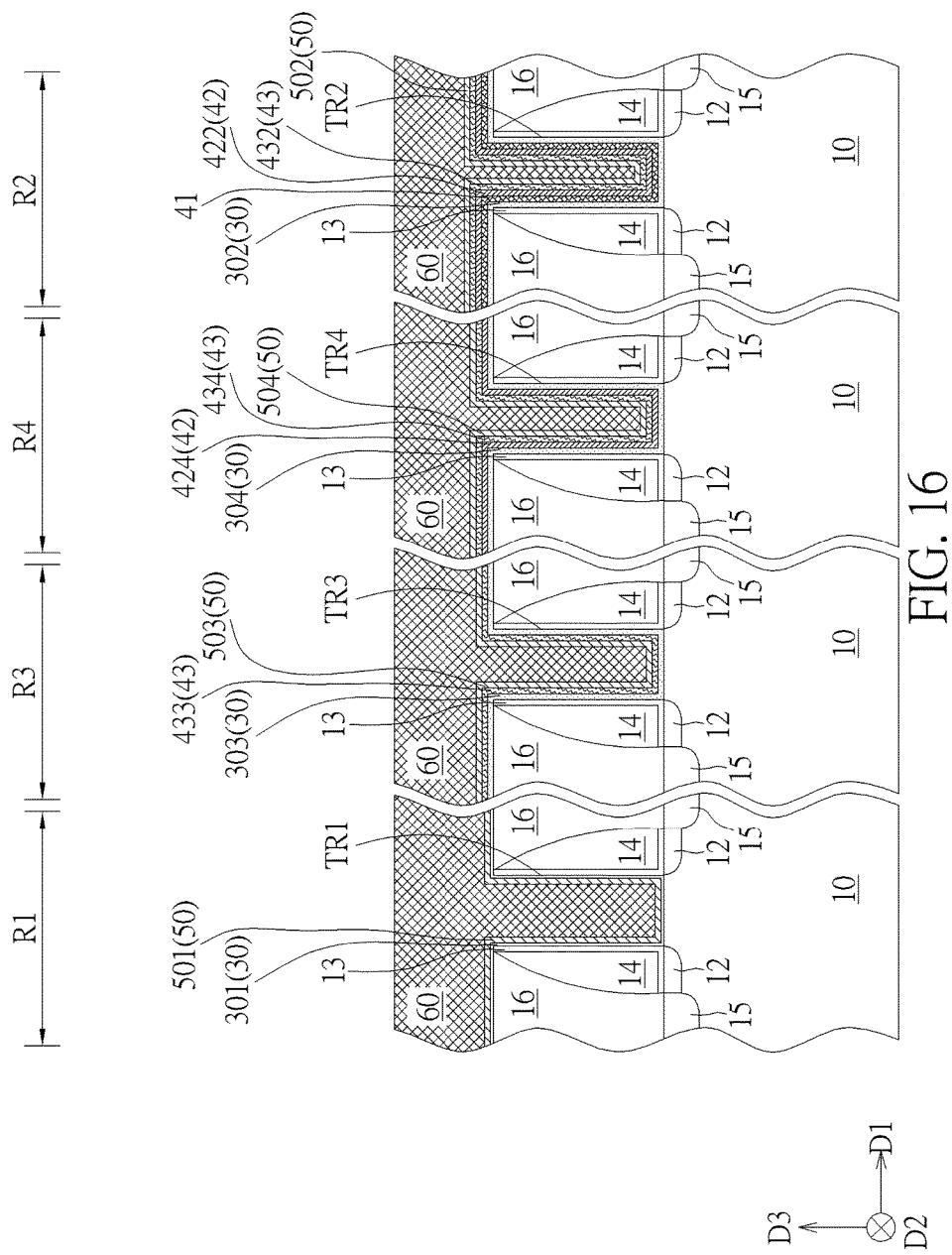
Figure 17:
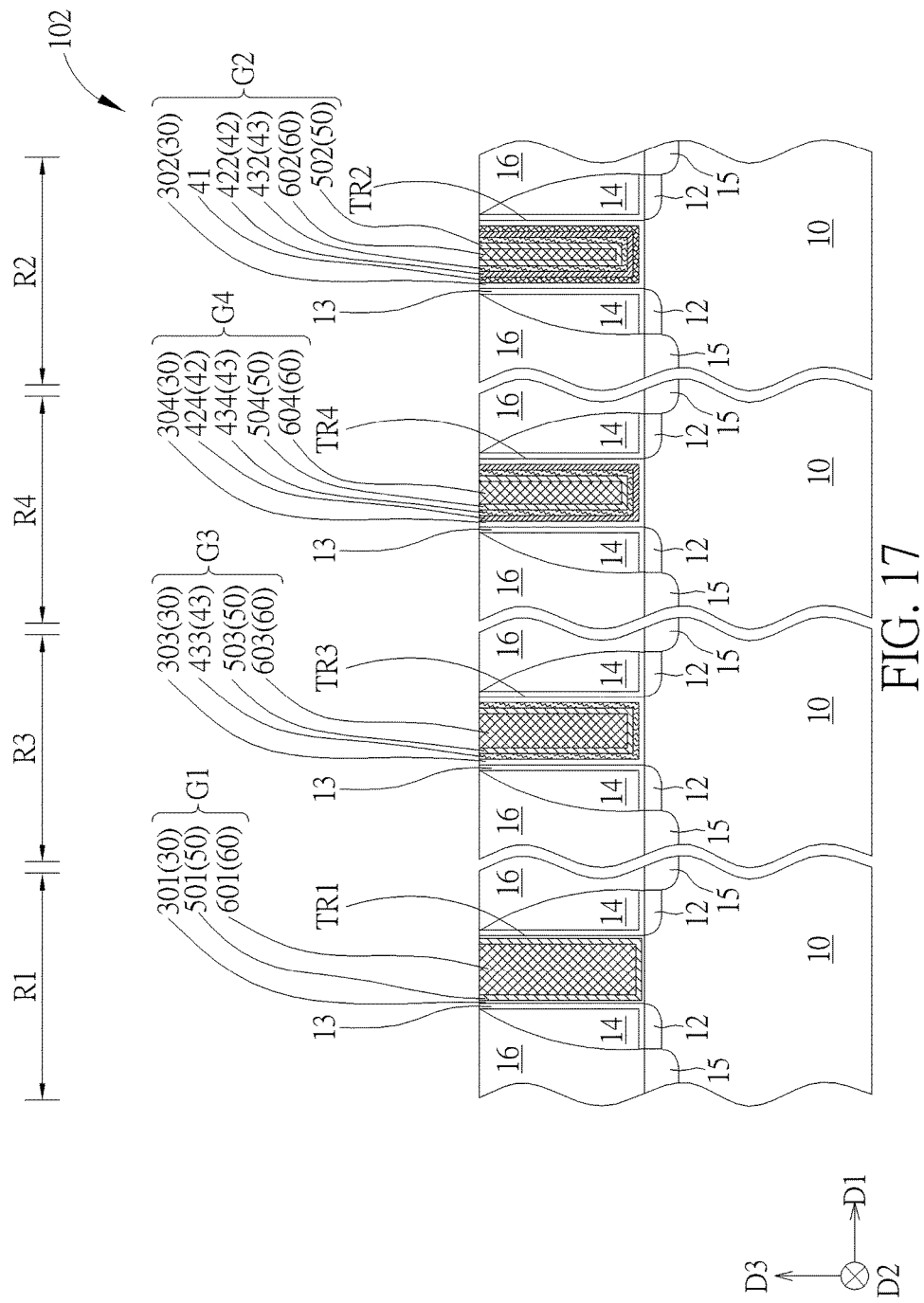

As shown in FIGS. 15-17, the second patterned mask layer 82 is removed after the second etching process 92, and the low resistivity layer 60 is then formed. The low resistivity layer 60 is partly formed in the first trench TR1, the second trench TR2, the third trench TR3, and the fourth trench TR4. Subsequently, a planarization process, such as a chemical mechanical polishing (CMP) process, may be used to remove the material layers outside the trenches and form the first gate structure G1, the second gate structure G2, a third gate structure G3, and a fourth gate structure G4. As shown in FIG. 17, a semiconductor device 102 is provided in this embodiment. The semiconductor device 102 includes the first transistor T1, the second transistor T2, a third transistor T3, and a fourth transistor T4. The first gate structure G1 of the first transistor T1 may include the first part 301 of the barrier layer 30, the first part 501 of the second work function layer 50, and the first part 601 of the low resistivity layer 60. The second gate structure G2 of the second transistor T2 may include the second part 302 of the barrier layer 30, the first work function layer 41, the second part 422 of the third work function layer 42, the second part 432 of the fourth work function layer 43, the second part 502 of the second work function layer 50, and the second part 602 of the low resistivity layer 60. The third gate structure G3 of the third transistor T3 may include the third part 303 of the barrier layer 30, the third part 433 of the fourth work function layer 43, a third part 503 of the second work function layer 50, and a third part 603 of the low resistivity layer 60. The fourth gate structure G4 of the fourth transistor T4 may include the fourth part 304 of the barrier layer, the fourth part 424 of the third work function layer 42, the fourth part 434 of the fourth work function layer 43, a fourth part 504 of the second work function layer 50, and a fourth part 604 of the low resistivity layer 60. In some embodiments, the first work function layer 41, the third work function layer 42, and the fourth work function layer 43 may be second conductivity type work function layers, such as P type work function layers, and the second work function layer 50 may be a first conductivity type work function layer, such as an N type work function layer. By the manufacturing method described above, the thickness of the second conductivity type work function layer in the second gate structure G2, the thickness of the second conductivity type work function layer in the third gate structure G3, and the thickness of the second conductivity type work function layer in the fourth gate structure G4 may be different from one another, and the conductivity types and/or the threshold voltages of the second transistor T2, the third transistor T3, and the fourth transistor T4 may be different from one another accordingly. For example, in this embodiment, the first transistor T1 may be used as a low threshold voltage N type transistor, the second transistor T2 may be used as a low threshold voltage P type transistor, the third transistor T3 may be used as a standard threshold voltage N type transistor, and the fourth transistor T4 may be used as a standard threshold voltage P type transistor, but not limited thereto.

To summarize the above descriptions, in the semiconductor device and the manufacturing method thereof according to the present invention, the barrier layer in the first region is thinned before the step of forming the first work function layer, and the second etching process for removing the first work function layer in the first region is performed after the first etching process. Compared with the etching time of a single etching process for removing the first work function layer in the first region and thinning the barrier layer in the first region at the same time, the etching time of the second etching process in the present invention may become relatively shorter. The side etching condition of the first work function layer in the adjacent second region may be improved for avoiding influencing the coverage of the first work function layer in the second region, and the electrical performance of the semiconductor device and the uniformity of the electrical performance may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a first conductivity type transistor comprising:
        a first gate structure comprising a first barrier layer; and
        a first part of a first conductivity type work function layer; and
    a second conductivity type transistor disposed adjacent to the first conductivity type transistor, wherein the second conductivity type transistor comprises:
        a second gate structure, wherein the first gate structure is directly connected to the second gate structure, and the second gate structure comprises:
            a second barrier layer, wherein the first barrier layer is thinner than the second barrier layer, the first barrier layer and the second barrier layer are directly connected with each other, and a step structure is formed at a juncture of the first barrier layer and the second barrier layer; and
        a second conductivity type work function layer disposed on the second barrier layer and a part of the first barrier layer, wherein the second conductivity type work function layer covers the step structure; and
        a second part of the first conductivity type work function layer, wherein the first part of the first conductivity type work function layer is directly connected with the second part of the first conductivity type work function layer.

2. The semiconductor device of claim 1, wherein the first part of the first conductivity type work function layer is disposed on the first barrier layer, and the second part of the first conductivity type work function layer is disposed on the second conductivity type work function layer.

3. The semiconductor device of claim 1, wherein the first conductivity type transistor comprises an N type transistor, the second conductivity type transistor comprises a P type transistor, and the second conductivity type work function layer comprises a P type work function layer.

* * * * *